(12) United States Patent
Sun et al.

(10) Patent No.: US 8,623,222 B2
(45) Date of Patent: Jan. 7, 2014

(54) MEMS-BASED MICRO AND NANO GRIPPERS WITH TWO AXIS FORCE SENSORS

(71) Applicants: Yu Sun, Toronto (CA); Keekyoung Kim, Toronto (CA)

(72) Inventors: Yu Sun, Toronto (CA); Keekyoung Kim, Toronto (CA)

(*) Notice: Subject to any disclaimer, the term of this patent is extended or adjusted under 35 U.S.C. 154(b) by 0 days.

(21) Appl. No.: 13/652,851

(22) Filed: Oct. 16, 2012

(65) Prior Publication Data

US 2013/0037512 A1  Feb. 14, 2013

Related U.S. Application Data

(62) Division of application No. 12/305,468, filed as application No. PCT/CA2007/001090 on Jun. 21, 2007, now Pat. No. 8,317,245.

(51) Int. Cl.
*C23F 1/00* (2006.01)

(52) U.S. Cl.
USPC ............................................................ 216/2

(58) Field of Classification Search
USPC ............................................. 216/2; 294/86.4
See application file for complete search history.

(56) References Cited

U.S. PATENT DOCUMENTS 6,648,389 B2 * 11/2003 Frey et al. ................... 294/86.4

\* cited by examiner

*Primary Examiner* — Roberts Culbert
(74) *Attorney, Agent, or Firm* — Miller Thomson LLP; Eugene Gierczak

(57) ABSTRACT

The present invention relates to a design and microfabrication method for microgrippers that are capable of grasping micro and nano objects of a large range of sizes and two-axis force sensing capabilities. Gripping motion is produced by one or more electrothermal actuators. Integrated force sensors along x and y directions enable the measurement of gripping forces as well as the forces applied at the end of microgripper arms along the normal direction, both with a resolution down to nanoNewton. The microfabrication method enables monolithic integration of the actuators and the force sensors.

10 Claims, 3 Drawing Sheets

A - A

A - A

B - B

MEMS-BASED MICRO AND NANO GRIPPERS WITH TWO AXIS FORCE SENSORS

PRIORITY

This application claims the benefit of Canadian Patent No. 2,551,191, filed 23 Jun. 2006, PCT Application No. PCT/CA2007/001090 filed Jun. 21, 2007 and is a divisional application of U.S. patent application Ser. No. 12/305,468 having a national entry date of Dec. 18, 2008.

FIELD OF THE INVENTION

The present invention relates to micro and nanosystems, and micro and nanotechnology.

BACKGROUND OF THE INVENTION

Intelligent manipulation (e.g., grasping/gripping) of micro- and nanometer-sized objects requires the use of miniaturized microgrippers with integrated force sensors. Currently, micro- and nanomanipulation typically relies purely on visual feedback either from an optical microscope or an electron microscope. The lack of force feedback at the microNewton and nanoNewton level severely limits intelligent micro- and nanomanipulation.

Besides miniaturization and electrical control, microgrippers must be capable of providing multi-axis force feedback to satisfy the following requirements: (i) to protect the microgripper and detect the contact between the microgripper and the object to be manipulated; and (ii) to provide gripping force feedback during grasping to obtain secured grasping while protecting the object to be grasped.

The vast majority of existing microgrippers lack force feedback due to the difficulty of integrating force sensors with microgrippers. The lack of force feedback does not permit force-controlled manipulation and easily causes breakage of microgrippers and damage to the object to be manipulated.

A recently reported electrothermally driven microgripper design is integrated with a single-axis piezoresistive force sensor that is only capable of measuring gripping forces. (See K. Molhave and O. Hansen, "Electrothermally actuated microgrippers with integrated force-feedback," *J. Micromechanics and Microengineering*, 15(6), pp. 1265-1270, 2005.) However, the gripping force sensing resolution is somewhat poor, on the order of milli-Newton that is orders of magnitude worse than what micro-nanomanipulation requires.

A recent paper reports a design of an electrostatically driven microgripper with a single-axis capacitive force sensor that is only capable of measuring gripping forces. (See F. Beyeler, D. J. Bell, B. J. Nelson, Yu Sun, A. Neild, S. Oberti, and J. Dual, "Design of a micro-gripper and an ultrasonic manipulator for handling micron sized objects," IEEE/RSJ International Conference on Intelligent Robots and Systems, Beijing, China, Oct., 2006.) Due to the limitation of electrostatic actuation (low force output, small displacements, and high driving voltage), the microgripper design is only capable of grasping objects of a small range of sizes.

The lack of force sensing capabilities along a second-axis down to nanoNewton in existing designs does not allow for the protection of microgrippers and the detection of contact between the microgripper and object to be manipulated. What is needed is design and microfabrication of microgrippers that are capable of grasping micro and nano objects of a large range of sizes and having two-axis force sensing capabilities.

SUMMARY OF THE INVENTION

In one aspect, the present invention employs MEMS (microelectromechanical systems) technology in the design and microfabrication of microgrippers that are capable of grasping micro and nano objects of a large range of sizes and two-axis force sensing capabilities.

In an embodiment of the present invention, integrated, single-chip, batch microfabricated MEMS devices are disclosed that are electrothermally-driven microgrippers with integrated dual-axis force sensing capabilities. The gripping motion is produced by an actuator, such as a bent-beam actuator. The bent-beam actuator requires little power and is capable of producing a large range of gripping forces and displacements. Integrated force sensors along the in-plane x and y directions using transverse differential capacitive comb drives enable the measurement of gripping forces as well as the forces applied at the end of microgripper arms along the normal direction, both with a resolution down to nanoNewton.

In another aspect, a microfabrication process for a microgripper is provided.

This microgripper design features two-axis force sensing capabilities suitable for use in intelligent micro and nanomanipulation. Additionally, the employment of bent-beam electrothermal microactuators permits the grasping of objects of a large range of sizes.

BRIEF DESCRIPTION OF THE DRAWINGS

A detailed description of one or more embodiments is provided herein below by way of example only and with reference to the following drawings, in which.

Figure 1:
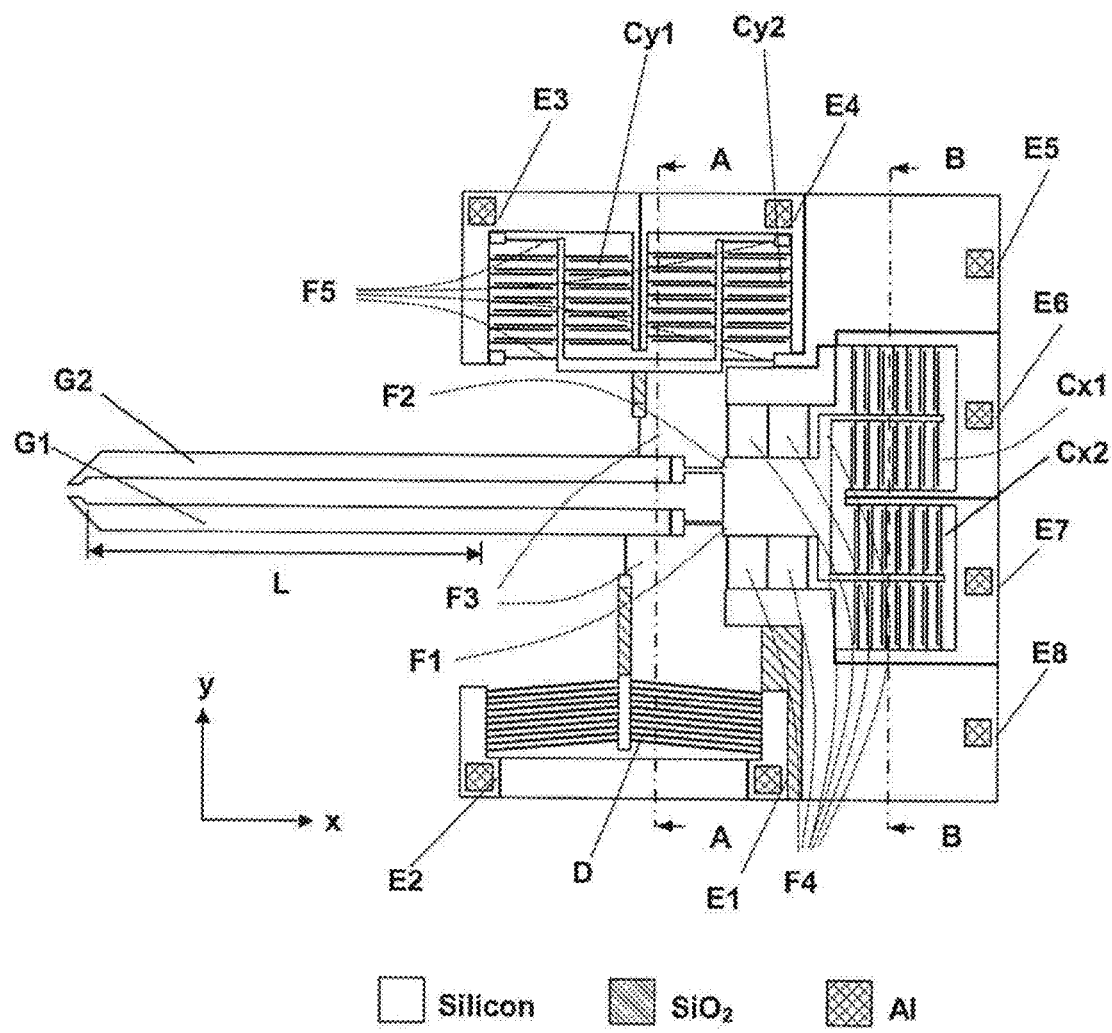
FIG. 1 illustrates a microgripper with integrated dual-axis capacitive force sensors.

In the drawings, one or more embodiments of the present invention are illustrated by way of example. It is to be expressly understood that the description and drawings are only for the purpose of illustration and as an aid to understanding, and are not intended as a definition of the limits of the present invention.

DETAILED DESCRIPTION OF THE INVENTION

In an embodiment of the present invention, an electrothermally actuated microgripper comprises four parts, as illustrated in FIG. 1: (i) electrothermal microactuator D to drive gripper arm G1; (ii) driving arm G1 and sensing arm G2 used together to grasp micro/nano objects; (iii) linear beam flexures F1, F2, F3, F4, and F5 used to transform forces into displacements; and (iv) pairs of capacitor plates forming capacitors Cx1, Cx2, Cy1, and Cy2 to transform displacements into capacitance changes. In this case, the electrothermal microacuator D is a bent-beam microactuator. However, it should he understood that other types of electrothermal actuators are possible and within the scope of the present invention, such as U-beam electrothermal actuators or electrostatic actuators, for example. It should also be understood that piezoresistive force sensors could be used instead of capacitive force sensors.

Electrothermal bent-beam microactuator D produces forces to deflect the microgripper arm G1 through flexure F3. When electrothermal forces are produced by applying voltages/current between electrodes E1 and E2, the translational movement of F3 is converted into a rotational movement of the driving arm G1. The displacement and driving force from a single bent-beam of the electrothermal microactuator are $$U = \alpha \Delta T l_d \frac{\sin\theta}{\left(\sin^2\theta + \cos^2\theta \frac{12 I_d}{A_d l_d^2}\right)}$$

$$F_d = \alpha \Delta T E A_d \frac{\cos\theta}{\left(\sin^2\theta \frac{A_d l_d^2}{12 I_d} + \cos^2\theta\right)}$$

where $\alpha$ is the coefficient of thermal expansion of the beam material, E is Young's modulus, $l_d$ is the beam length, $A_d$ is the beam cross sectional area, $I_d$ is the moment of inertia, and $\theta$ is the bending angle of bent beams. The bending of flexure F1 increases the reaction force of G1; however, this contribution from the bending of flexure F1 is trivial and thus, can be neglected. The displacement of the end of G1 is amplified by an amplification factor from the displacement of the bent-beam microactuator.

The second microgripper arm G2 is supported by flexures F2 and F5 and is connected to the capacitive force sensor Cy1 and Cy2. G2 transmits gripping forces to the movable capacitor plates of the transverse comb drive Cy1 and Cy2 that together form a differential comb drive. As a gripping force $F_g$ is applied, flexure F5 is deformed and the capacitance change of Cy1 and Cy2 can be measured through electrodes E3, E4, and E5. The bending force of flexure F2 converts the rotational motion of G2 into a translational displacement that is small and can be neglected.

$$F_g = 4 \frac{E t w_g^3}{l_g^3} x$$

where l is the length of the flexures F5, t is the out-of-place thickness, $w_g$ is the in-plane width, and x is the deflection. The capacitance C for each comb drive is $$C = \frac{\varepsilon_0 n A}{d}$$

where $\varepsilon_0$ is the dielectric constant, n the number of capacitor plate pairs, A is the overlapping area, and d is the gap distance. Changing the gap d instead of the overlapping area A provides a high change of capacitance for a small displacement $\Delta d$ and thus increases the resolution of force sensing.

When the microgripper approaches a micro object, it is difficult to detect from pure visual feedback the contact between the microgripper arms and the substrate. Thus, x-directional (i.e. longitudinal) force feedback is necessary for contact detection and to avoid the breakage of the microgripper. In addition, the x-directional force feedback can also be used to measure the tensile strength or adhesion force, such as biological cells sticking on a substrate, by gripping and pulling. As flexures F3 and F4 are deflected, capacitance changes Cx1 and Cx2 are measured through electrodes E6, E7 and E8. Cx1 and Cx2 together form a differential comb drive.

Flexures F1 and F2 are designed to be deformed in the y-direction and translate forces in the y-direction (i.e. lateral direction). In contrast, flexure F3 is designed to be deformed in the x-direction and translate forces in the x-direction. Besides serving as flexures, F4 and F5 are also used for electrical signal routing. Flexure F5 must be such designed that it has a high enough stiffness in the x-direction to protect Cy1 and Cy2 from the rotational motion of gripper arms G1 and G2.

In order to obtain a linear relationship between force/displacement and capacitance/voltage changes, differential comb drive structures are used for Cx and Cy $$Cx1 = \varepsilon_0 \frac{A_x}{d_1 - x} + \varepsilon_0 \frac{A_x}{d_2 + x}, \quad Cx2 = \varepsilon_0 \frac{A_x}{d_1 + x} + \varepsilon_0 \frac{A_x}{d_2 - x}$$

$$Cy1 = \varepsilon_0 \frac{A_y}{d_1 - y} + \varepsilon_0 \frac{A_y}{d_2 + y}, \quad Cy2 = \varepsilon_0 \frac{A_y}{d_1 + y} + \varepsilon_0 \frac{A_y}{d_2 - y}$$

where $d_1$ is the smaller gap and $d_2$ is the larger gab between two capacitive plates along the x and y-direction, x is the deflection in x-direction, y is the deflection in the y-direction, and Ax and Ay are the overlapping area. The capacitor plates of the capacitors Cx1 and Cx2 are oriented parallel to the xz-plane. The capacitor plates of the capacitor Cy1 and Cy2 are oriented parallel to the yz-plane. To determine the gripping force $F_g$, the deflection of flexure F5 in the y-direction is measured via Cy1 and Cy2. To determine the force Fx to the normal direction of microgripper arms, Cx1 and Cx2 are measured.

Figure 2:
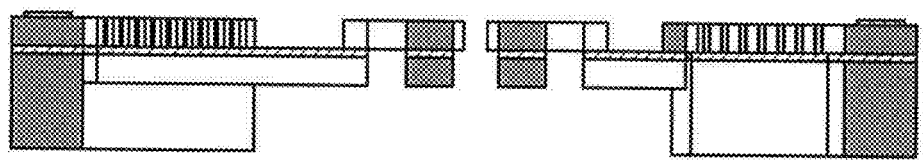
FIG. 2 is a cross sectional view of the microgripper corresponding to FIG. 1 along axis A-A.
Figure 3:
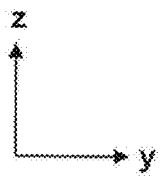
FIG. 3 is a cross sectional view of the microgripper corresponding to FIG. 1 along axis B-B.
Figure 3:
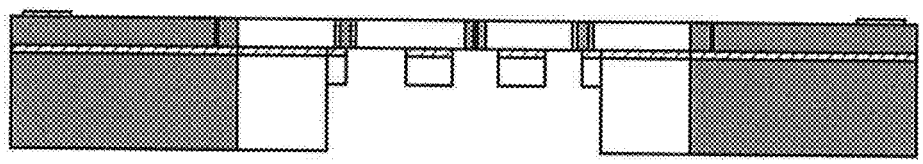

The length of microgripper arm L can be larger than 3.0 mm for the purpose of operating in an aqueous environment, such as for handling biological cells. To make the arms mechanically connected and electrically insulated, the gripper arms are preferably connected using the handle layer of an SOI (Silicon on Insulator) wafer as shown in FIGS. 2 and 3. The buried oxide layer, device layer, and handle layer are used together to form the structure and achieve electrical signal routing.

Figure 4:
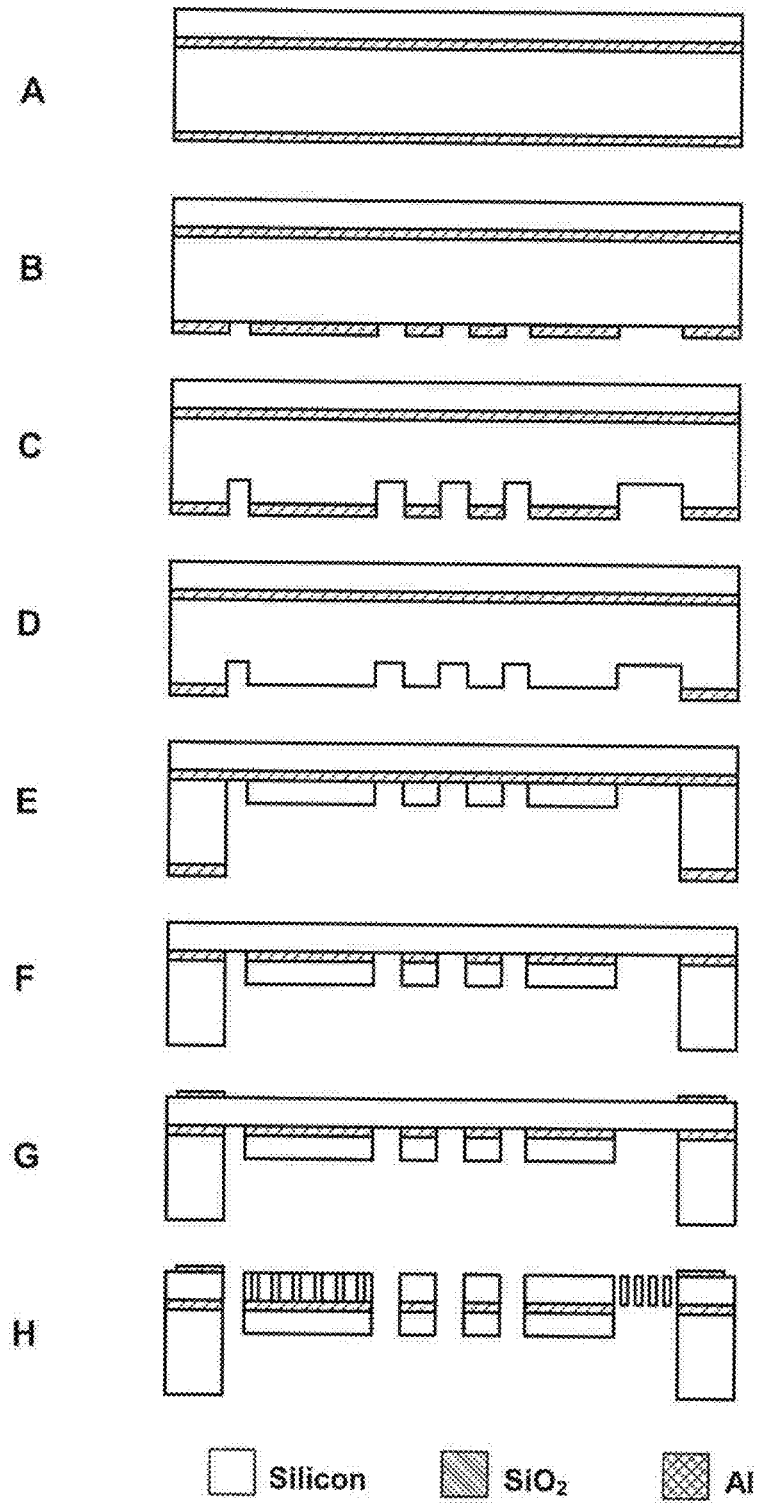
FIG. 4 illustrates microfabrication steps for the construction of a microgripper.

FIG. 4 shows a microfabrication process of the microgripper, as an example. According to application needs, an SOI wafer having a 200-500 μm thick handle layer, 1-2 μm thick SiO$_2$ and 0.5-300 μm thick device layer can be chosen, as an example. A total of 4 photolithography masks are required to construct the microgrippers.

In particular, the specific steps as illustrated include:
A) SiO$_2$ is deposited on the handle layer of SOI wafer.
B) SiO$_2$ is patterned to form DRIE (Deep Reactive Ion Etching) etch mask (mask 1).
C) Center part of photo resist is removed (mask 2) and handle layer of the wafer is etched up to 50 μm forming the structure for electrical insulation and mechanical connection.
D) Center part of SiO$_2$ is etched.
E) Handle layer of the wafer is etched again up to handle layer thickness minus up to half the thickness of the handle layer, e.g., 50 μm.
F) Buried oxide layer is etched.
G) Ohmic contacts are formed by e-beam evaporation and patterned by lift-off (mask 3).
H) Device layer of wafer is etched to form the structural, elements thereof, including in this case gripper arms, flexures, bent-beam actuators, and comb drives (mask 4), for the microgripper of this example.

Note that changing the tethering spring dimensions and capacitance readout circuits can allow devices in accordance with the present invention to resolve forces down to pico-Newtons. Force resolution at this level enable a larger range of applications, particularly in nano device assembly and biophysics studies in which individual molecules are manipulated and characterized.

It should be understood that the present invention is the first of its kind in terms of actuation range for grasping a range of micro-nano objects and sensing forces along two axes. The stumbling block in this area has been the monolithic integration of both actuators and force sensors, but is achieved by the present invention. The present invention also provides for the novel de-coupling of force sensing along two axes.

It will be appreciated by those skilled in the art that other variations of the one or more embodiments described herein are possible and may be practised without departing from the scope of the present invention.

What is claimed is:

1. A microfabrication method incorporating photolithography masking to produce a microgripper device operable to grasp objects varying from micro to nanoNewton and having two-axis force sensing capabilities, characterised in that the method comprises:
   (a) depositing a silicon dioxide layer onto a handle layer, wherein the handle layer is resident on a silicon on insulator wafer, the wafer comprising a device layer and a buried oxide layer, wherein the buried oxide layer is between the silicon oxide layer and the device layer;
   (b) patterning the silicon dioxide layer using an etching means to form a first mask;
   (c) etching an area of the wafer to remove a first portion of the handle layer exposed by the first mask;
   (d) etching the area of the wafer to remove the dioxide layer;
   (e) etching the area of the wafer to remove a second portion of the handle layer so that a portion of the buried oxide layer is exposed;
   (f) etching to remove the portion of the buried oxide layer;
   (g) forming ohmic contacts; and
   (h) etching the device layer to form structural elements of the microgripper device.

2. The microfabrication method of claim 1, further chararacterised in that the structural elements include gripper arms, flexures, actuators and capacitive force sensors.

3. The microfabrication method of claim 1, further characterised in that the actuators are bent-beam actuators, U-beam electrothermal actuators or electrostatic actuators.

4. The microfabrication method of claim 1, further characterised in that the handle layer is 100 to 500 microns thick.

5. The microfabrication method of claim 1, further characterised in that the silicon oxide layer is 0.5 to 4 microns thick.

6. The microfabrication method of claim 1, further characterised in that the device layer is 0.5 to 300 microns thick.

7. The microfabrication method of claim 1, further characterised in that the first portion of the handle layer is up to half the thickness of the handle layer.

8. A method of microfabrication incorporating photolithography masking comprising multiple stages of etching a silicon on insulator wafer having multiple layers to produce structural elements of a gripping device operable to grasp objects varying from micro to nanoNewton and having two-axis force sensing capabilities, said method comprising the steps of;
   (a) depositing a silicon dioxide layer on the handle layer of the silicon on insulator wafer and forming a deep reactive ion etching etch mask by pattering the silicon dioxide layer deposited on the handle layer of the silicon on insulator water;
   (b) forming the structure for electrical insulation and mechanical connection by etching the handle layer; and
   (c) forming structural elements including gripper arms, flexures, bent-beam actuators and combs drives by etching the device layer of the silicon on insulator wafer.

9. The method of microfabrication of claim 8, further comprising the step of producing a gripping device includes gripper arms, flexures, actuators and comb drives.

10. The method of microfabrication of claim 8, further comprising the step of forming ohmic contacts by e-beam evaporation and lift-off patterning on the silicon on insulator wafer.

* * * * *